United States Patent
Schalowski et al.

(10) Patent No.: US 8,534,641 B2
(45) Date of Patent: Sep. 17, 2013

(54) CONNECTING ELEMENT AND ASSOCIATED FLUID ASSEMBLY

(75) Inventors: Gerhard Schalowski, Dettingen (DE); Bernd Kellner, Waltenhofen (DE); Volker Weeber, Lauffen A.N. (DE); Rainer Fuerst, Immenstadt (DE); Heiko Fresser, Stuttgart (DE); Martin Haas, Oberstenfeld (DE); Wolfgang Mailaender, Hemmingen (DE); Bernd Lutz, Kempten (DE)

(73) Assignee: Robert Bosch GmbH, Stuttgart (DE)

( * ) Notice: Subject to any disclaimer, the term of this patent is extended or adjusted under 35 U.S.C. 154(b) by 275 days.

(21) Appl. No.: 12/746,394

(22) PCT Filed: Oct. 16, 2008

(86) PCT No.: PCT/EP2008/063921
§ 371 (c)(1),
(2), (4) Date: Jun. 4, 2010

(87) PCT Pub. No.: WO2009/071381
PCT Pub. Date: Jun. 11, 2009

(65) Prior Publication Data
US 2010/0252764 A1    Oct. 7, 2010

(30) Foreign Application Priority Data
Dec. 4, 2007   (DE) .................. 10 2007 058 243

(51) Int. Cl.
*F16K 31/02*   (2006.01)
(52) U.S. Cl.
USPC ............ 251/129.15; 439/66; 439/80; 439/81; 439/700

(58) Field of Classification Search
USPC ...... 251/129.15; 137/884; 303/119.1–119.3; 335/282, 275, 296, 299; 439/66, 80, 81, 439/404–405, 395–396, 884, 700
See application file for complete search history.

(56) References Cited

U.S. PATENT DOCUMENTS

| 4,926,548 A | * | 5/1990 | Hopkins et al. | 29/860 |
| 5,112,235 A | * | 5/1992 | Enomoto et al. | 439/83 |
| 5,122,066 A | * | 6/1992 | Plossmer | 439/78 |
| 5,275,478 A | * | 1/1994 | Schmitt et al. | 303/119.2 |
| 5,306,169 A | * | 4/1994 | Fukushima et al. | 439/248 |
| 5,508,671 A | * | 4/1996 | Takashi | 335/296 |

(Continued)

FOREIGN PATENT DOCUMENTS

| DE | 19619968 A1 | 11/1997 |
| DE | 19929209 A1 | 1/2001 |
| WO | 0053475 A1 | 9/2000 |
| WO | 02055355 A2 | 7/2002 |

*Primary Examiner* — John K Fristoe, Jr.
*Assistant Examiner* — Marina Tietjen
(74) *Attorney, Agent, or Firm* — Maginot, Moore & Beck

(57) ABSTRACT

The invention relates to a connecting element for the electric connection of a solenoid valve to a circuit board, having a first electric contact element for electrically contacting the solenoid valve, a second electric contact element for electrically contacting the circuit board, and at least one tolerance adjusting element, and a related fluid assembly. According to the invention the connecting element is configured as one piece, and the first electric contact element and the second electric contact element are connected to each other via the at least one tolerance adjusting element. A first modifiable tolerance adjusting element enables a length adjustment in at least one spatial direction in order to predetermine a desired spatial positioning of the first contact element and the second contact element relative to each other.

14 Claims, 3 Drawing Sheets

(56) References Cited

U.S. PATENT DOCUMENTS

| | | | |
|---|---|---|---|
| 6,155,856 A * | 12/2000 | Sanada | 439/246 |
| 6,412,754 B1 * | 7/2002 | Ogino et al. | 251/129.15 |
| 6,633,216 B2 * | 10/2003 | Lewin et al. | 335/220 |
| 6,985,060 B2 * | 1/2006 | Parker et al. | 335/282 |
| 7,158,372 B2 * | 1/2007 | Sanada et al. | 361/752 |
| 7,322,834 B2 * | 1/2008 | Hu et al. | 439/83 |
| 7,753,715 B2 * | 7/2010 | Freakes | 439/395 |
| 7,867,016 B2 * | 1/2011 | Nabilek et al. | 439/474 |
| 2002/0093411 A1 | 7/2002 | Lewin et al. | |
| 2004/0067698 A1 * | 4/2004 | Lee | 439/885 |
| 2004/0266272 A1 * | 12/2004 | Maruyama et al. | 439/700 |
| 2006/0258199 A1 * | 11/2006 | Umehara et al. | 439/247 |

\* cited by examiner

CONNECTING ELEMENT AND ASSOCIATED FLUID ASSEMBLY

CROSS-REFERENCE TO RELATED APPLICATION

This application is a 35 USC 371 application of PCT/EP2008/063921 filed on Oct. 16, 2008.

BACKGROUND OF THE INVENTION

1. Field of the Invention

The invention relates to a connecting element for electrically connecting a first component to a second component, and to an associated fluid assembly.

2. Description of the Prior Art

A conventional fluid assembly, which is used for instance in an anti-lock brake system (ABS) or traction control system (TC system) or an electronic stability program system (ESP system), as a rule includes a control unit and a fluid block, which includes at least one fluid component, embodied for instance as a fluid block or pump motor, and at least one fluid control element, which is embodied for instance as a valve cartridge that is part of an associated solenoid valve. For triggering the at least one fluid component and the at least one fluid control element, the control unit includes a printed circuit board, which is simultaneously used as a circuit holder and for attaching a customer plug, located on the housing, and the solenoid valves. The control unit furthermore includes magnet assemblies that are also part of the particular associated solenoid valve and are necessary for adjusting the fluid control elements embodied as valve cartridges. Via electric magnet coils, each of the magnet assemblies generates a magnetic force by way of which the fluid control elements are adjustable, and these fluid control elements adjust volumetric flows that are carried in fluid conduits of the fluid component embodied as a fluid block. The magnet coils typically comprise an ion circuit, a winding holder, and a wire winding, and they can be connected electrically to electronic circuits on the printed circuit board. The electrical magnet coils of the magnet assemblies are electrically contacted via a stamped grating that is electrically connected to at least one electronic circuit of the printed circuit board, and the magnet assemblies electrically connected to the printed circuit board via the stamped grating are mounted on the fluid control elements embodied as valve cartridges, which are for instance firmly connected, and preferably calked, to the fluid component embodied as a fluid block. The stamped grating used, which is very complicated both structurally and in terms of tools, is quite inflexible and can be altered only with difficulty during the service life of the fluid block. Moreover, in conjunction with the printed circuit board technology, a further electrical connection piece, for instance in the form of individual connection pins, is necessary between the stamped grating and the printed circuit board.

In German Published Patent Application DE 44 12 664 A1, for instance, an electrohydraulic pressure adjusting device is described for a slip-control vehicle brake system. The described pressure adjusting device has at least one valve, united with a valve block, having a valve dome protruding from the valve block, under which dome a coil disposed in a cap can be slipped. Electrical contact elements, joined together by material engagement, extend from both the coil and the cap. The electrical contact elements of the coil and of the cap are embodied resiliently. They take on the task of both electrical connection and the retention function for the coil. Moreover, they permit aligning the coil with the valve dome as it is being mounted. The electrical contact elements of the cap are embodied as stamped grating strips, which are cast integrally with the cap that is of an insulating material. The stamped grating strips extend at a right angle to the plane extending along the longitudinal axis of the coil and have meandering offset bends, as a result of which the stamped grating strips have a relatively high elastic resilience in a plane extending at a right angle to the longitudinal compensation of the coil. The stamped grating strips, on their free end, have a securing lug that extends parallel to the associated connection wire of the coil and is joined to it by a material-engagement connection such as welding or soldering.

ADVANTAGES AND SUMMARY OF THE INVENTION

The connecting element of the invention for electrically connecting a magnet coil of a solenoid valve to a printed circuit board has the advantage over the prior art that the connecting element is embodied in one piece, and the first electrical contact element and the second electrical contact element are connected to one another via the at least one tolerance compensation element, and a first variable tolerance compensation element enables a longitudinal compensation in at least one spatial direction, in order to predetermine a desired spatial positioning of the first contact element and the second contact element relative to one another.

A fluid assembly having a connecting element of the invention for electrically connecting a magnet assembly of a solenoid valve to a printed circuit board of a control unit has the advantage over the prior art that a magnet coil of the magnet assembly is connected electrically to the printed circuit board via at least one connecting element of the invention, and the first contact element of the connecting element is connected to one connecting dome of the magnet assembly, and the second electrical contact element of the connecting element is connected to a contact region of the printed circuit board. The magnet assembly, after the electrical connection to the printed circuit board, is mounted on a valve cartridge that protrudes past a fluid block of the fluid assembly, and a first variable tolerance compensation element, which connects the first contact element to the second contact element, enables a longitudinal compensation in at least one spatial direction, in order to predetermine a desired spatial positioning of the first contact element and second contact element to one another and to compensate for existing positional tolerances, since the magnet coil surrounds the valve cartridge, secured in the fluid block, with a radial play. The tolerance compensation element can also compensate for changes in length caused by temperature changes. With the connecting element of the invention, the magnet coil can advantageously be electrically connected directly to the printed circuit board without stamped gratings and without a welding or soldering operation.

It is especially advantageous that the two contact elements implement different types of cold contact, and the types of cold contact include an insulation displacement connector (IDC) and/or a plug connection. With the use of an IDC, it is no longer necessary to strip off the insulation paint of the coil wire at the wire ends of the winding. Moreover, in an IDC or plug connection, thermal processes that are vulnerable to malfunction are unnecessary, and hence the process monitoring and the process devices can be achieved more economically.

The connecting element of the invention is embodied for instance as a one-piece stamped part, which can be produced simply and economically.

In a feature of the connecting element of the invention, the first contact element, for making the electrical IDC to the coil wire, for instance has a cutting element. In addition, the first contact element has an integrally formed-on mechanical connection element, for connecting the first contact element mechanically to a corresponding contact receptacle of the magnet assembly. The second contact element is embodied on one end for instance as a plug connection, which can be introduced into a corresponding plug receptacle in the printed circuit board in order to make an electrical and mechanical connection. The second contact element embodied as a plug connection can have a mechanical connection element on its other end, with which connection element the second contact element can be press-fitted into an opening.

In a feature of the fluid assembly of the invention, the first contact element is introduced with the cutting element into a corresponding connecting dome, and the cutting element, in a joining step, scrapes off the insulation paint of the coil wire, and by overpressing makes a gastight electrical connection between the first contact element and the coil wire. The integrally formed-on mechanical connection element, for instance via an external set of teeth, makes the mechanical connection inside the corresponding connecting dome of the magnet assembly. The second contact element is embodied on one end for instance as a plug connection, which for making an electrical and mechanical connection can be introduced into a corresponding plug receptacle in the printed circuit board. Moreover, the second contact element embodied as a plug connection, on its other end, can have a mechanical connection element with which the second contact element can be press-fitted into an opening in an intermediate floor of the control unit. The mechanical connection element can be connected, for instance via a detent contour with overpressing, to the intermediate floor of the control unit. As a result, the two contact elements of the connecting element can advantageously be uncoupled mechanically, so that from the magnet assembly, no mechanical forces are transmitted to the electrical cold contact of the second contact element in the printed circuit board.

In a further feature of the fluid assembly of the invention, the first tolerance compensation element, disposed between the first electrical contact element and the second electrical contact element, performs a longitudinal compensation in at least one spatial direction, in order to predetermine a desired spatial positioning of the first contact element and second contact element relative to one another, and a lateral spacing between the two contact elements is selected such that the second contact element, with the mechanical connection element, protrudes laterally past the magnet assembly. A second tolerance compensation element, disposed between the first contact element and the mechanical connection element, performs a longitudinal compensation between the printed circuit board and the intermediate floor of the control unit.

Advantageous embodiments of the invention are shown in the drawings and will be described below. In the drawings, the same reference numerals identify components and elements that perform the same or analogous functions.

BRIEF DESCRIPTION OF THE DRAWINGS

The invention will be described in further detail in the ensuing description in conjunction with the accompanying drawings.

DESCRIPTION OF THE PREFERRED EMBODIMENTS

Figure 1:
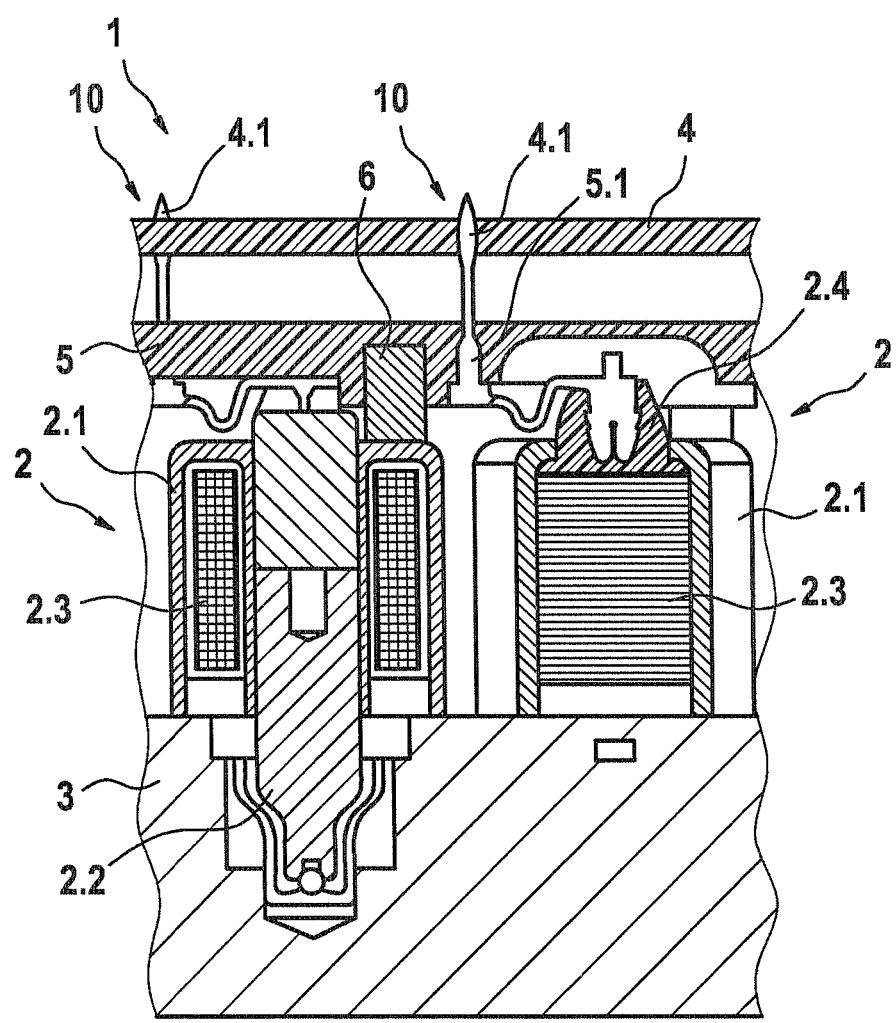
FIG. 1 shows a schematic sectional view of a fluid assembly of the invention.

As can be seen from FIG. 1, a fluid assembly 1 of the invention includes a fluid block 3, a printed circuit board 4 disposed in a control unit, and a plurality of solenoid valves 2, of which two solenoid valves 2 are shown. The solenoid valves 2 each include one magnet assembly 2.1, having a magnet coil 2.3, and two connecting domes 2.4 and one valve cartridge 2.2 secured in the fluid block 3. The magnet assemblies 2.1 of the solenoid valves 2 are each mounted on the valve cartridges 2.2 protruding past the fluid block 3. The magnet coils 2.3 of the magnet assemblies 2.1 are connected electrically to the printed circuit board 4 via two connecting elements 10 of the invention. As can also be seen from FIG. 1, the magnet assemblies 2.1 are each pressed against the fluid block 3 by an elastic retaining element 6, which is braced on the intermediate floor 5 of the control housing, in order to prevent or reduce a vibration load on the connecting elements 10.

Figure 2:
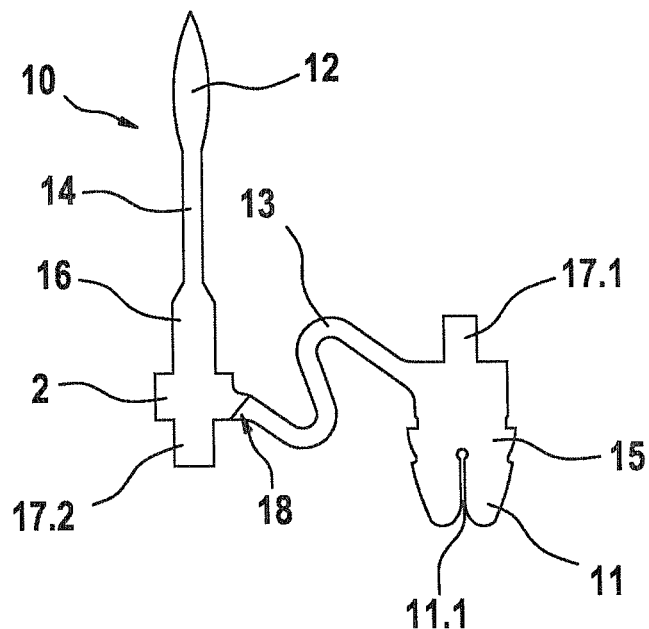
FIG. 2 shows a schematic view of a connecting element of the invention.

As can be seen from FIG. 2, a connecting element of the invention for electrically connecting the magnet coil 2.3 to the printed circuit board 4 includes a first electrical contact element 11 for electrically contacting the magnet coil 2.3 and a second electrical contact element 12 for electrically contacting the printed circuit board 4; the two contact elements 11, 12 are joined to one another via a first tolerance compensation element 13 and a second tolerance compensation element 14.

As can also be seen from FIG. 2, the connecting element 10 in the exemplary embodiment shown is embodied as a one-piece stamped part. The two contact elements 11, 12 achieve different types of cold contact; the first contact element 11 includes a cutting element 11.1 for making an electrical IDC with a coil wire of the magnet coil 2.3 and also includes an integrally formed-on mechanical connection element 15, in order to connect the first contact element 11 mechanically to the corresponding connecting dome 2.4 of the magnet assembly 2.1. The second contact element 12, on one end, is embodied as a plug connection, which can be introduced or press-fitted into a corresponding plug receptacle 4.1, shown in FIG. 1, in the printed circuit board 4 in order to make an electrical and mechanical connection, for achieving the cold contact of the plug connection and the plug receptacle 4.1. On the other end, the second contact element 12 embodied as a plug connection has a mechanical connection element 16, with which the second contact element 12 can be press-fitted into an opening 5.1, shown in FIG. 1, in an intermediate floor 5 of the control unit. The first variable tolerance compensation element 13 enables a longitudinal compensation in at least one spatial direction, in order to predetermine a desired spatial positioning of the first contact element 11 and the second contact element 12 relative to one another. The second tolerance compensation element 14 is disposed between the second contact element 12 and the mechanical connection element 16 and enables a longitudinal compensation between the printed circuit board 4 and the intermediate floor 5 of the control unit.

As can also be seen from FIG. 2, the second contact element 12, as a function of the embodiment of the plug receptacle 4.1 or of the press-fitting zone in the printed circuit board 4, can have a material thickness that is defined differently from the first contact element 11, so that an abrupt change in material thickness 18 occurs between the second contact element 12 and the first tolerance compensation element 13. The abrupt change in material thickness 18 may for instance be embodied by a milled step.

Thus the connecting elements 10 of the invention connect the magnet coils 2.3 of the magnet assemblies 2.1 electrically to the electronics on the printed circuit board 4. Mechanically, the connecting element 10 is connected to an opening 5.1 in the intermediate floor 5 of the control unit, for instance via a mechanical connection element 16 embodied as a detent contour, with overpressing. This assures that no mechanical forces from the magnet coil 2.3 are transmitted to the electrical cold contact of the second contact element 12 in the printed circuit board 4. The IDC of the first contact element 11 to the connecting dome 2.4 is shaped such that in the cutting element 11.1, embodied as a slit, the electrical cold contact with the coil wire of the magnet coil 2.3 is made, and the mechanical connection to the connecting dome 2.4 of the magnet assembly 2.1 is made on the mechanical connection element 15, embodied as an external set of teeth.

Figure 3:
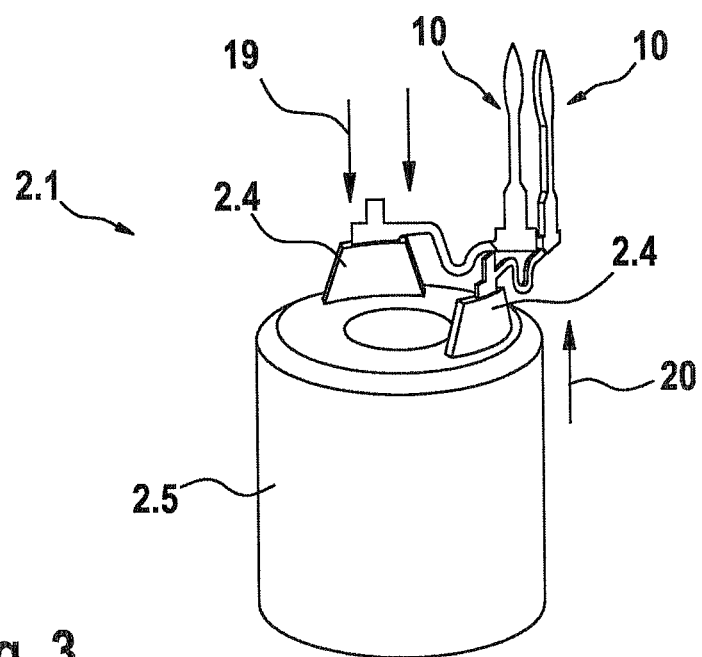
FIG. 3 shows a schematic perspective view of a magnet assembly for the fluid assembly of the invention in FIG. 1.
Figure 4:
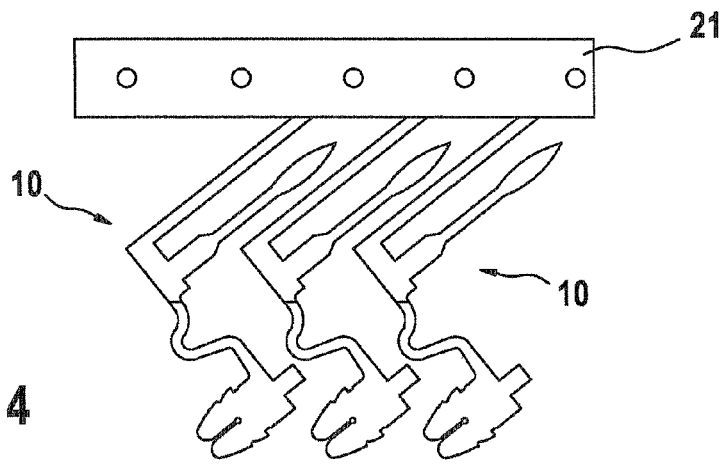
FIG. 4 shows a schematic view of a belt with a plurality of connecting elements of the invention.
Figure 5:
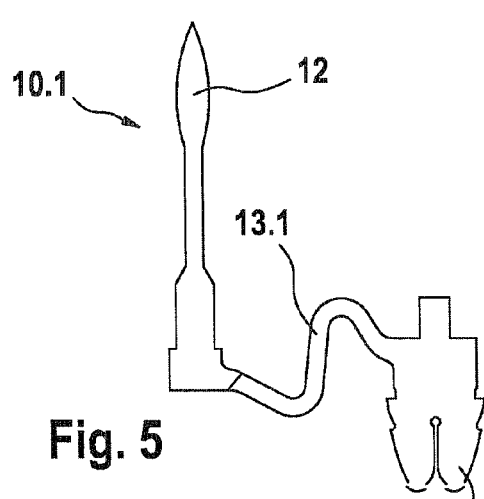
FIGS. 5 through 8 show various embodiments of the connecting element of the invention.
Figure 6:
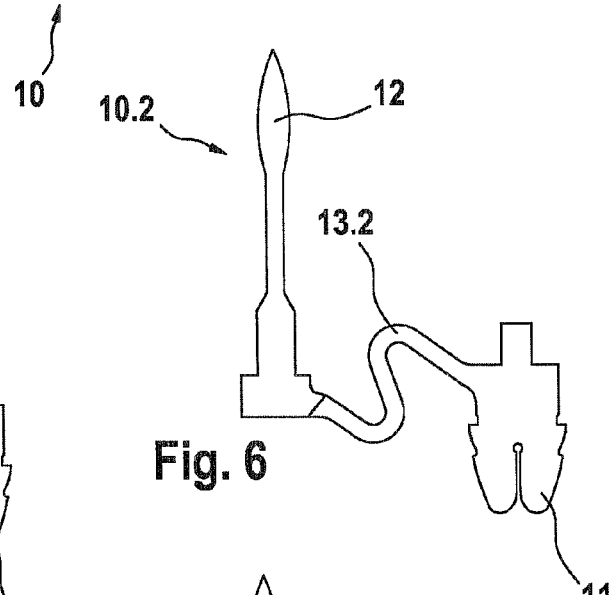
Figure 7:
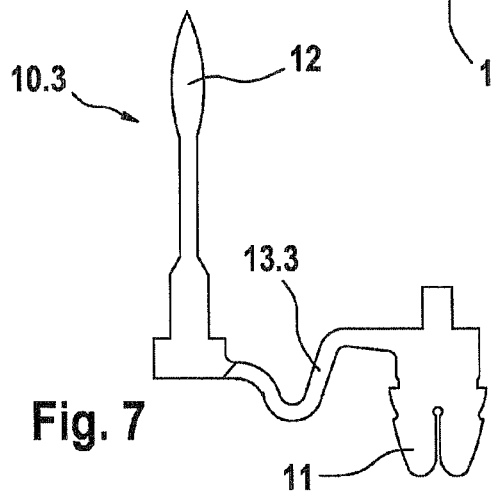
Figure 8:
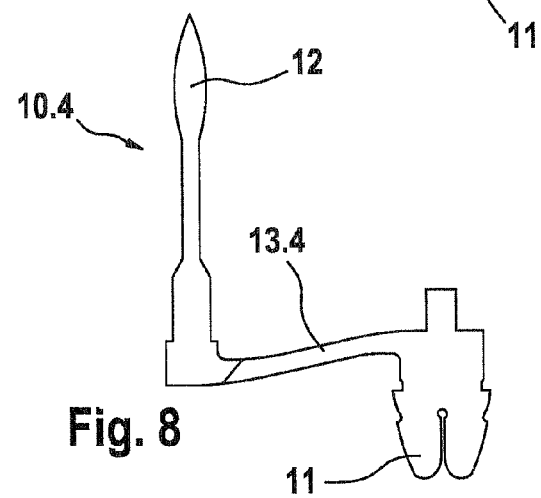

As can be seen from FIG. 3, a magnet assembly 2.1, shown as an example, includes two connecting domes 2.4 and one housing jacket 2.5, which covers the magnet coil 2.3 that is wound onto a winding body. For assembling the two connecting elements 10 for contacting the magnet assembly 2.1, the connecting elements 10 are furnished on a belt 21, as can be seen in FIG. 4, separated, and grasped with a gripper at a first gripper position 17.1 (FIG. 2) above the first contact element 11 and are thrust into the corresponding connecting dome 2.4 of the magnet assembly 2.1, as indicated in FIG. 3 by the directional arrows 19; by means of the IDC, the electrical contact of the first contact element 11 with the coil wire is made. The lateral extension outward of the connecting elements 10 past the diameter of the magnet assembly 2.1 makes direct grasping of the connecting element 10 possible at a second gripper position 17.2 (FIG. 2) below the second contact element 12 and also enables the force-reinforced press-fitting of the connecting element 10 along with the magnet assembly 2.1 into the intermediate floor 5 of the control unit housing in the direction of the directional arrow 20. Moreover, the forces that act on the second contact element 12 during the pressing on of the printed circuit board 4 can be absorbed via these gripper positions 17.2. The magnet coil 2.3 surrounds the valve cartridge 2.2, secured in the fluid block 3, with a very slight radial play, and thus the position of the magnet coil 2.3 that is premounted in the control unit is varied directly by the positional tolerances of the valve cartridge. Since the locking positions of the connecting elements 10 in the intermediate floor 5 of the control unit housing are independent of these tolerances, the connecting elements 10, as a result of the first tolerance compensation elements 13, have the capability of tolerance compensation once and for all upon assembly. Thus the second contact elements 12 can be grasped via the second gripper position 17.2 and, by deformation of the first tolerance compensation elements 13, they are aligned for assembly with the corresponding opening 5.1 in the intermediate floor 5 of the control unit housing. The first tolerance compensation elements 13 each extend essentially at a right angle to the longitudinal axis of the first contact element 11 and to the longitudinal axis of the second contact element 12, so that the longitudinal axes of the two contact elements 11 and 12 extend essentially parallel to one another. In the exemplary embodiment shown, the first tolerance compensation element 13 has two meandering offset bends, as a result of which each connecting element 10 has a relatively high elastic resilience between the two contact elements 11, 12. FIGS. 5 through 8 show various exemplary embodiments, respectively, of the connecting element 10.1, 10.2, 10.3, 10.4 of the invention and the various possible geometric shapes for the first tolerance compensation element 13.1, 13.2, 13.3, 13.4, although the practical embodiment of the first tolerance compensation element 13 is not limited to the shapes shown.

The connecting element of the invention and the fluid assembly of the invention advantageously perform a requisite tolerance compensation between the magnet assembly and the wiring plane, make cost economy possible by reduction in the number of parts and quantities of material, processes, systems, and so forth, and enhance the flexibility and modularizability for various applications, for instance in an anti-lock brake system (ABS) or traction control system (TC system) or an electronic stability program system (ESP system). Moreover, the space requirements in the overall system can be reduced.

The foregoing relates to the preferred exemplary embodiments of the invention, it being understood that other variants and embodiments thereof are possible within the spirit and scope of the invention, the latter being defined by the appended claims.

The invention claimed is:

1. A connecting element for electrically connecting a solenoid valve to a printed circuit board, the connecting element comprising:
   a first electrical contact element for electrically contacting the solenoid valve;
   a second electrical contact element for electrically contacting the printed circuit board; and
   a first variable tolerance compensation element configured to connect the first electrical contact element and the second electrical contact element to one another,
   wherein the first variable tolerance compensation element is configured to longitudinally compensate in at least one spatial direction, in order to predetermine a spatial positioning of the first contact element and the second contact element relative to one another,
   wherein the connecting element is embodied in one piece,
   wherein a first end of the second contact element defines a plug connection that is configured to be introduced into a corresponding plug receptacle in the printed circuit board to electrically and mechanically connect the second contact element and the printed circuit board,
   wherein a second end of the second contact element defines a mechanical connection element that is configured to be press-fitted into an opening in an intermediate floor, which is positioned between the printed circuit board and the solenoid valve,
   wherein the first contact element defines a first longitudinal axis,
   wherein the second contact element defines a second longitudinal axis that is offset from the first longitudinal axis,
   wherein the first variable tolerance compensation element extends generally transverse to both the first longitudinal axis and the second longitudinal axis, and
   wherein the connecting element further comprises a second variable tolerance compensation element disposed between plug connection and the mechanical connection element of the second contact element to longitudinally compensate between the plug connection and the mechanical connection element.

2. The connecting element as defined by claim 1, wherein the first contact element and the second contact element implement different types of cold contact, and the types of cold contact include an insulation displacement connector and/or a plug connection.

3. The connecting element as defined by claim 2, wherein the connecting element is embodied as a one-piece stamped part.

4. The connecting element as defined by claim 3, wherein the first contact element includes a cutting element, for making an electrical IDC with a coil wire, and an integrally formed-on mechanical connection element, in order to connect the first contact element mechanically to a corresponding contact receptacle of the solenoid valve.

5. The connecting element as defined by claim 2, wherein the first contact element includes a cutting element, for making an electrical IDC with a coil wire, and an integrally formed-on mechanical connection element, in order to connect the first contact element mechanically to a corresponding contact receptacle of the solenoid valve.

6. The connecting element as defined by claim 1, wherein the connecting element is embodied as a one-piece stamped part.

7. The connecting element as defined by claim 1, wherein the first contact element includes a cutting element, for making an electrical IDC with a coil wire, and an integrally formed-on mechanical connection element, in order to connect the first contact element mechanically to a corresponding contact receptacle of the solenoid valve.

8. A fluid assembly comprising:
a fluid block,
a printed circuit board disposed in a control unit,
at least one solenoid valve, which includes a valve cartridge secured in the fluid block and a magnet assembly having a magnet coil and two connecting domes, the magnet assembly being mounted on the valve cartridge, which protrudes past the fluid block; and
an intermediate floor of the control unit that is interposed between the at least one solenoid valve and the printed circuit board,
wherein the magnet coil is connected electrically to the printed circuit board via at least one connecting element,
wherein the at least one connecting element includes:
a first electrical contact element for electrically contacting the solenoid valve;
a second electrical contact element for electrically contacting the printed circuit board; and
a first variable tolerance compensation element that connects the first electrical contact element and the second electrical contact element to one another,
wherein the first variable tolerance compensation element is configured to longitudinally compensate in at least one spatial direction in order to predetermine a spatial positioning of the first contact element and the second contact element relative to one another,
wherein the connecting element is embodied in one piece,
wherein a first end of the second contact element defines a plug connection that is connected to a corresponding plug receptacle in a contact region of the printed circuit board to electrically and mechanically connect the second contact element and the printed circuit board,
wherein a second end of the second contact element defines a mechanical connection element that is press-fitted into an opening in the intermediate floor, and
wherein the first contact element is connected to one of the connecting domes.

9. The fluid assembly as defined by claim 8, wherein the first contact element has a cutting element, which in a corresponding connecting dome makes an electrical IDC with a coil wire of the magnet coil, and a formed-on mechanical connection element, which mechanically connects the first contact element to the corresponding connecting dome of the magnet assembly.

10. The fluid assembly as defined by claim 9, further comprising:
a second variable tolerance compensation element,
wherein the first variable tolerance compensation elements is disposed between the first electrical contact element and the second electrical contact element to longitudinally compensate in the at least one spatial direction in order to predetermine the spatial positioning of the first contact element and the second contact element relative to one another, and a lateral spacing between the first contact element and the second contact element is selected such that the second contact element protrudes with the mechanical connection element laterally past the magnet assembly, and
wherein the second variable tolerance compensation element is disposed between the plug connection and the mechanical connection element to longitudinally compensate between the printed circuit board and the intermediate floor of the control unit.

11. The fluid assembly as defined by claim 8, further comprising:
a second variable tolerance compensation element,
wherein the first variable tolerance compensation element is disposed between the first electrical contact element and the second electrical contact element to longitudinally compensate in the at least one spatial direction in order to predetermine the spatial positioning of the first contact element and the second contact element relative to one another, and a lateral spacing between the first contact element and the second contact element is selected such that the second contact element protrudes with the mechanical connection element laterally past the magnet assembly, and
wherein the second variable tolerance compensation element is disposed between the plug connection and the mechanical connection element to longitudinally compensate between the printed circuit board and the intermediate floor of the control unit.

12. The fluid assembly as defined by claim 8, wherein the first contact element and the second contact element implement different types of cold contact, and the types of cold contact include an insulation displacement connector and/or a plug connection.

13. The fluid assembly as defined by claim 8, wherein the at least one connecting element is embodied as a one-piece stamped part.

14. The fluid assembly as defined by claim 8, wherein the first contact element includes a cutting element, for making an electrical IDC with a coil wire, and an integrally formed-on mechanical connection element, in order to connect the first contact element mechanically to a corresponding contact receptacle of the solenoid valve.

* * * * *